United States Patent [19]

Smith

[11] 4,242,604

[45] Dec. 30, 1980

[54] MOS INPUT CIRCUIT WITH SELECTABLE STABILIZED TRIP VOLTAGE

[75] Inventor: Frederick J. Smith, Cupertino, Calif.

[73] Assignee: National Semiconductor Corporation, Santa Clara, Calif.

[21] Appl. No.: 932,516

[22] Filed: Aug. 10, 1978

[51] Int. Cl.³ .................. H03K 17/687; H03K 17/14; H03K 19/092; H03K 3/356

[52] U.S. Cl. .................................. 307/251; 307/205; 307/290; 307/DIG. 1

[58] Field of Search ..................... 307/205, 214, 200 B, 307/251, 304, 362, 279, 290, 270, DIG. 1; 330/277

[56] References Cited

U.S. PATENT DOCUMENTS

| | | | |
|---|---|---|---|
| 3,581,120 | 5/1971 | Nord ..................................... | 307/290 |
| 3,873,856 | 3/1975 | Gerlach et al. .................. | 307/290 X |
| 4,064,468 | 12/1977 | Kumata ........................ | 58/23 AC X |
| 4,110,641 | 8/1978 | Payne .............................. | 330/277 X |

OTHER PUBLICATIONS

Frantz, "Threshold Voltage Control for N-Channel MOSFET Devices", *IBM Tech. Discl. Bull.*, vol. 12, No. 12, 5/1970.

*Primary Examiner*—Larry N. Anagnos
*Attorney, Agent, or Firm*—Brown & Martin

[57] ABSTRACT

Disclosed is an integrated buffer circuit having a selectable stabilized trip voltage. The circuit includes an input stage and a reference stage. Each of these stages includes an MOS field effect transistor, a substantially constant resistance device coupling the drain of the input transistor to a bias source, and a device having a resistance that is variable in response to control signals coupling the source of the input transistor to another bias source. The reference stage is biased in the linear region at the selectable trip voltage. A signal generated at the drain of the transistor in the reference stage is connected to all of the variable resistance devices as the control signal. This signal varies the variable resistance in such a way as to compensate for threshold voltage variations in the transistor of the input stage and thus stabilize the selected trip voltage of the input stage.

10 Claims, 4 Drawing Figures

BUFFER

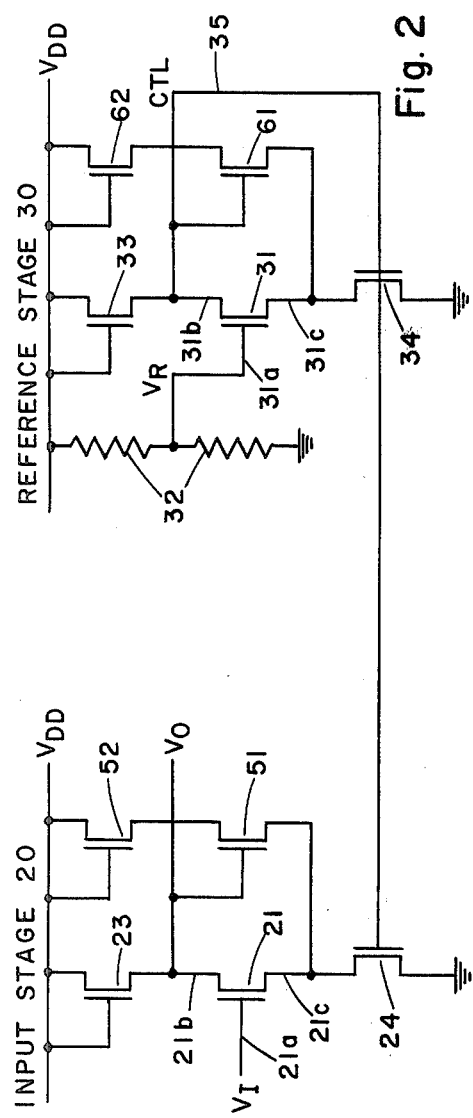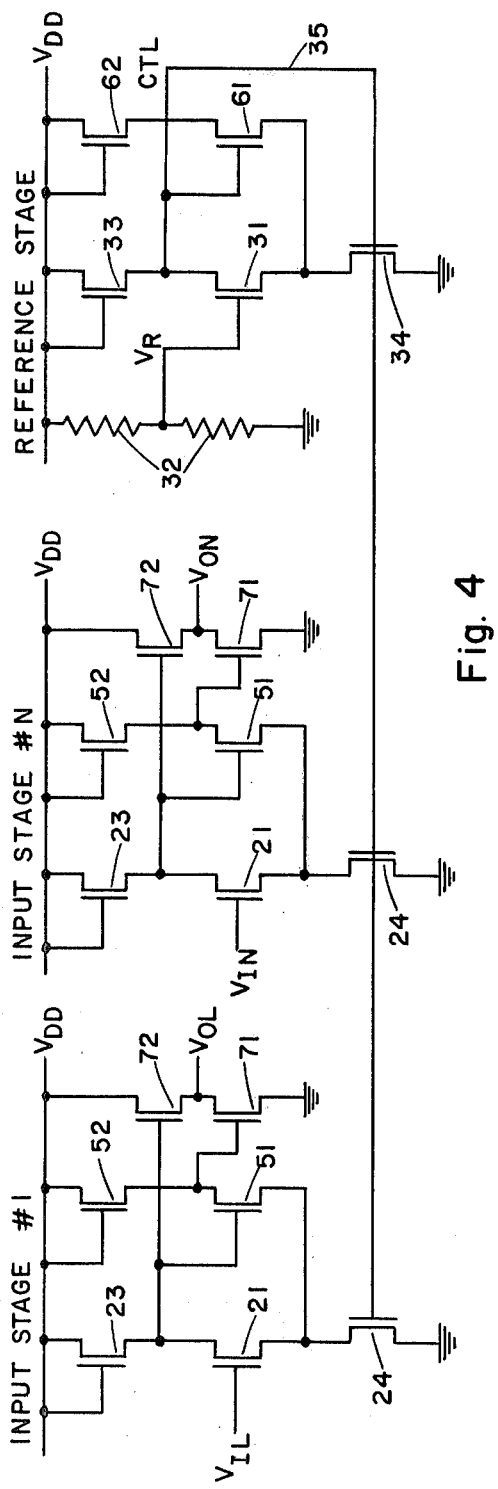

MOS INPUT CIRCUIT WITH SELECTABLE STABILIZED TRIP VOLTAGE

BACKGROUND OF THE INVENTION

This invention relates to buffer circuits, and more particularly to buffer circuits comprised of field effect transistors on an integrated circuit. Basically, buffer circuits perform the task of receiving input signals that switch between two input levels, and generating output signals which switch between two different voltage levels. Typically, the two input levels are designated $V_{IL}$ and $V_{IH}$; while the output signals are designated $V_{OL}$ and $V_{OH}$. In this nomenclature, $V_{IL}$ represents a low input voltage, $V_{IH}$ represents a high input voltage, $V_{OL}$ represents a low output voltage, and $V_{OH}$ represents a high output voltage.

As a specific example of the above, buffer circuits commonly are used to convert $T^2L$ input signals to output signals that are more compatible for use with MOS circuits. For $T^2L$ signals, $V_{IL}$ and $V_{IH}$ respectively are approximately 0.8 volts and 2.0 volts. In comparison, suitable $V_{OL}$ and $V_{OH}$ voltage levels for MOS circuits are approximately 1.0 volts and 10.0 volts.

It is desirable for the buffer circuit to have a "trip" voltage lying approximately midway between $V_{IH}$ and $V_{IL}$. "Trip" voltage is defined as the input voltage which causes the output signal to lay midway between $V_{OH}$ and $V_{OL}$. Thus a trip voltage midway between $V_{IL}$ and $V_{IH}$ gives the circuit maximum noise immunity. That is, spurious transitions on the input signal from $V_{IL}$ or $V_{IH}$ should not cause the output to switch; and this is achieved by setting the trip voltage midway between $V_{IL}$ and $V_{IH}$.

Unfortunately, however, in many prior art buffer circuits, the trip voltage varies directly with the threshold voltage of the field effect transistors which comprise the buffer circuit. The threshold voltage is that voltage at which the field effect transistors begin to substantially conduct. This voltage varies greatly with process variations, VBB or body voltage variations and temperature variations.

For example, process variations such as gate oxide thickness, substrate doping concentration, implant density, and channel length variations due to lateral diffusion of implants typically cause the threshold voltage to vary between 0.5 volts and 1.5 volts at a fixed temperature and fixed body voltage. Further, VBB voltage variations in the range of ±20% around its nominal value typically produces threshold voltage variations of about 200 millivolts. Such a range of VBB is typically required for part qualification by various chip users. Further, threshold voltage typically decreases by approximately 300 millivolts as the temperature varies from 0° C. to 100° C. All of these variations in threshold voltage cause corresponding variations in trip voltage for buffer circuits, which in turn gives them lower noise immunity.

Accordingly, it is one object of the invention to provide an improved buffer circuit.

Another object of the invention is to provide a buffer circuit having a selectable trip voltage.

Still another object of the invention is to provide a buffer circuit having a trip voltage that is substantially insensitive to threshold voltage variations.

SUMMARY OF THE INVENTION

These and other objects are accomplished in accordance with the invention by an integrated buffer circuit having an input stage and a reference stage. Each of these stages include a field effect input transistor. The drain of this transistor couples through a resistor to a bias source, and the source of this transistor couples through a variable resistor to another bias source. The resistance of the variable resistor is varied in response to a control signal. This control signal is supplied by the drain of the input transistor in the reference stage.

A reference voltage is applied to the gate of the input transistor of the reference stage to bias that stage in its linear region. Due to the symmetry of the input stage and the reference stage, the input stage will also be operating in its linear region when an input signal applied to the gate of its input transistor equals the reference voltage. In other words, the trip voltage of the input stage equals the reference voltage of the reference stage.

This relationship holds true even though the threshold voltage of the input transistor in both stages may vary substantially due to variations in processing, temperature and VBB.

For example, suppose that the threshold voltages of the input transistors decrease. The input transistor of the reference stage will then become more conductive; which in turn decreases the magnitude of the control signal. In response, the resistance of the variable resistor increases, which raises the voltage at the source of the input transistor in the input stage. This compensates for the decreased threshold voltage. Alternatively, if the threshold voltages of the input transistors of both stages increase, the control signal increases, which lowers the voltage at the source of the input transistor of the input stage to compensate for the threshold voltage increase.

BRIEF DESCRIPTION OF THE DRAWINGS

Various preferred embodiments of the invention will best be understood by reference to the following detailed description when read in conjunction with the accompanying drawings, wherein:

FIG. 2 is a detailed circuit diagram of one embodiment of a buffer circuit constructed according to the invention.

FIG. 4 is a detailed circuit diagram of a second embodiment of a buffer circuit constructed according to the invention.

DETAILED DESCRIPTION

Figure 1:
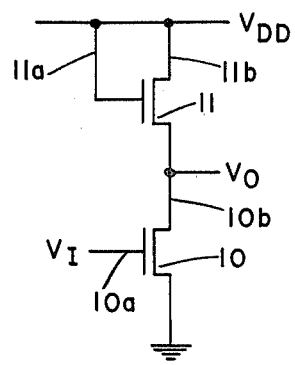
FIG. 1 is a detailed circuit diagram of a prior art buffer circuit.

In order to better appreciate the disclosed invention, a prior art buffer circuit will first be described in conjunction with FIG. 1. This circuit is comprised of an input field effect transistor 10 having a resistive load 11. Commonly, resistive load 11 also is a field effect transistor having a gate 11a and a drain 11b connected to a supply voltage as illustrated. Input signals $V_I$ are applied to a gate 10a of transistor 10; and output signals $V_O$ are developed at a drain 10b of transistor 10.

One problem with the FIG. 1 circuit is that its trip voltage is not stable. In particular, the trip voltage of the FIG. 1 circuit varies directly with the threshold voltage of transistor 10. And as previously described, threshold voltage of field effect transistors cannot be tightly controlled because it depends on process variations, body voltage variations, and temperature variations. Due to these variations, the FIG. 1 circuit typically has a threshold voltage of one volt plus or minus one-half volt. This in turn causes the trip voltage to also vary by plus or minus one-half volt.

Referring now to FIG. 2, one preferred embodiment of a buffer circuit constructed according to the invention will be described. This circuit, in comparison to the FIG. 1 circuit, has a trip voltage which is highly stable. In other words, variations in the threshold voltage of the various field effect transistors contained in the FIG. 2 circuit do not significantly affect the trip voltage of the circuit. This fact will be confirmed by analysis which follows shortly.

Basically, the FIG. 2 buffer is comprised of an input stage 20 and a reference stage 30. Stages 20 and 30 respectively include field effect input transistors 21 and 31. A gate 21a of transistor 21 receives input signals $V_I$, while a gate 31a of transistor 31 receives a reference voltage $V_R$. Voltage $V_R$ is selectively fixed to bias stage 30, somewhere in its linear region. As is shown below, voltage $V_R$ will equal the trip voltage of input stage 20. Thus the trip voltage for the input stage is selectable as well as stable. Voltage $V_R$ may suitably be generated by a variety of circuits, such as the illustrated voltage divider 32 for example.

Also included in the FIG. 2 circuits is a resistive load device 23 connected to a drain 21b of the transistor 21; and a resistive load device 33 connected to a drain 31b of transistor 31. Typically, load devices 23 and 33 each consist of a single field effect transistor as illustrated, although each may consist of a group of transistors. They present a load of substantially constant resistance for input transistors 21 and 31. An output signal $V_O$ is generated at drain 21b, and a control signal CTL is generated at drain 31b. Their magnitudes are inversely proportional to the current through loads 23 and 33 respectively.

Further included in the FIG. 2 buffer circuit are variable resistance devices 24 and 34. They connect respectively to a source 21c of transistor 21 and a source 31c of transistor 31. Preferably, devices 24 and 34 each are a single field effect transistor as illustrated. A lead 35 connects drain 31b to the gate of transistors 24 and 34. This applies control signal CTL to these gates. In this manner, the resistance of transistors 24 and 34 is made to vary inversely with magnitude of signal CTL. This in turn compensates for threshold voltage variations in transistors 21 and 31.

To illustrate how this compensation operates, suppose for example, that the threshold voltage of transistor 21 has decreased (due to processing variation, temperature variations, etc.) from some nominal value. In order to compensate for this lower threshold voltage, it is desirable to increase the voltage at source 21c by a corresponding amount in order to maintain a constant trip voltage. The circuit of FIG. 2 accomplishes this task as follows. First, a decrease in threshold voltage for transistor 21 will be accompanied by a corresponding decrease in threshold voltage for transistor 31. This is because both transistors 21 and 31 are fabricated together on the same chip at the same time, and thus are subjected to the same process variation. For example, if the gate oxide thickness of transistor 21 is slightly less than nominal, then the gate oxide thickness of transistor 31 will also be slightly less than nominal.

As a result of the decrease in threshold voltage in transistor 31, its drain to source resistance decreases for any given gate bias $V_R$. Thus control signal CTL decreases in magnitude. In response, the voltage at source 21c will increase for any given amount of current through transistor 24. This increase in voltage in turn compensates for the threshold voltage decrease of transistor 21.

Alternatively, suppose for example that due to processing variations, temperature variations, etc., the threshold voltage of transistor 21 increases. Due to the symmetry of fabrication the threshold voltage of transistor 31 also increases by a corresponding amount. As a result, for any given reference voltage $V_R$, transistor 31 becomes less conductive. This in turn, increases the magnitude of control signal CTL; which decreases the resistance through transistors 24 and 34. Thus, the voltage at source 21c decreases for any given current through transistor 21; and this compensates for the increase in threshold voltage of that transistor.

Figure 3:
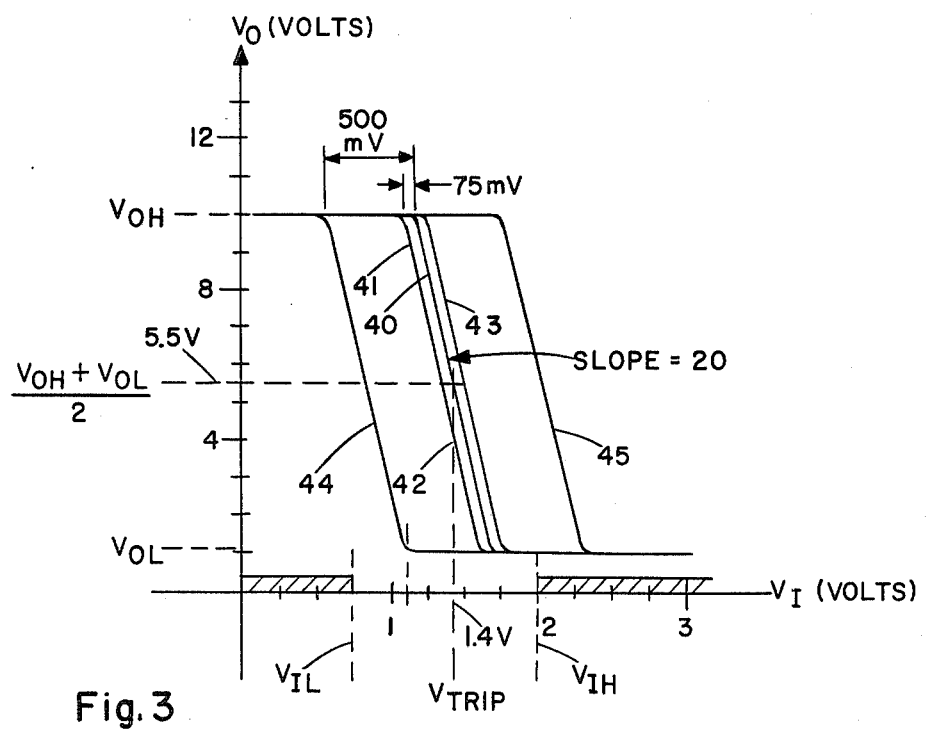
FIG. 3 is a set of curves illustrating the operation of the circuits of FIGS. 1 and 2.

A more quantitative analysis can be made with the aid of the curves of FIG. 3. In that figure, input signal $V_I$ is read in volts from the horizontal axis; while output signal $V_O$ is read in volts on the vertical axis. Signal $V_I$ has a maximum low level $V_{IL}$ and a minimum high level $V_{IH}$. That is, generally the input signal is either less than $V_{IL}$ or greater than $V_{IH}$. Signal $V_I$ should lie between $V_{IL}$ and $V_{IH}$ only during switching. However, in an operating system, noise spikes may be induced onto signal $V_I$ to thereby cause it to lie somewhere between $V_{IL}$ and $V_{IH}$. It therefore is desirable to have the trip voltage V trip midway between $V_{IL}$ and $V_{IH}$ in order to obtain maximum noise immunity. $V_R$ can be chosen to place V trip midway between $V_{IL}$ and $V_{IH}$ under nominal conditions. The question then becomes, to what extent does V trip for the FIG. 2 circuit vary in response to variations in threshold voltage of transistors 21 and 31.

To answer this question, first consider curve 40 in FIG. 3. This curve represents the transfer characteristic of the FIG. 2 circuit when transistors 21 and 31 have a nominal threshold voltage of one volt. Under these conditions, midway point between $V_{OH}$ and $V_{OL}$ is 5.5 volts and the trip voltage is 1.4 volts, as illustrated in FIG. 3.

Suppose next for example, that the threshold voltage of transistors 21 and 31 drops from this nominal value to one-half volt. In response, signal CTL will decrease as described above to some voltage below 5.5 volts, such as 4.0 volts for example. Due to the symmetry of input stage 20 and reference stage 30, signal $V_O$ will also equal 4.0 volts when signal $V_I$ equals 1.4 volts. This is illustrated by a new transfer curve 41 in FIg. 2. Specifically, point 42 on curve 41 shows $V_O$ equal to 4.0 volts when $V_I$ equals 1.4 volts.

One can determine the variation from the nominal trip voltage which is caused by the one-half volt variation in threshold voltage by dividing the variation in the output signal $V_O$ by the gain of the circuit. In this example, the output voltage varied from 5.5 volts to 4.0 volts; and the gain of the circuit is approximately 20 as indicated by the slope of curves 40 and 41. Thus, the variation of trip voltage from the nominal value is the difference between 5.5 volts and 4.0 volts divided by 20; or only 75 millivolts.

A similar analysis of the FIG. 2 circuit can be made to determine the variation in trip voltage that results due to a one-half volt increase in the threshold voltage of transistors 21 and 31. A curve 43 in FIG. 3 represents the transfer characteristics of the FIG. 2 circuit under these conditions. Basically, due to the linear operation of stage 30, a one-half volt increase in threshold voltage produces a 75 millivolt increase in trip voltage for stage 20.

To summarize, variations in threshold voltage for transistors 21 and 31 of plus or minus one-half volt results in trip voltage variations for stage 20 of only plus or minus 75 millivolts. In comparison, in the FIG. 1 circuit, variations in threshold voltage for transistor 10 of plus or minus one-half volt results in variations in trip voltage of plus or minus a half a volt. This is indicated in FIG. 3 by curves 44 and 45.

Also included in the FIG. 2 embodiment are MOS field effect transistors 51, 52, 61, and 62. Transistors 51 and 52 operate in stage 20 to maintain a current flow through transistor 24 when transistor 21 is off. This in turn insures that the compensating voltage level at source 21c will be maintained regardless of whether or not transistor 21 is on. In comparison, stage 30 is always biased in the linear region. Thus, transistors 61 and 62 are included only to maintain symmetry between stages 20 and 30.

Suitably, transistors 23, 33, 52, and 62 are identical in size and thus have an identical impedance. However, if a buffer circuit having historesis is desired, this may be achieved by making the resistance through transistors 52 and 62 slightly less than the resistance through transistors 23 and 33. Then when transistor 51 is turned on, it will supply slightly more current through transistor 24 than does transistor 21 when it is turned on. As a result, when transistor 51 is on, the voltage at source 21c will be slightly higher. Thus the input signal $V_I$ must also be made slightly higher in order to turn transistor 21 on and turn transistor 51 off.

Similarly, when transistor 51 is turned off, the voltage at source 21c will be slightly less than normal. Therefore, signal $V_I$ must drop to a slightly smaller level in order for transistor 21 to turn off and transistor 51 to turn on.

Another embodiment of the invention is illustrated in FIG. 4. This embodiment is similar to the FIG. 2 embodiment; and like parts are identified by like reference numerals. One difference between the two embodiments is that in FIG. 4, a plurality of input stages are connected in parallel to the reference stage. They simultaneously receive control signal CTL. Thus, if a particular design requires a plurality of buffers, the reference stage need not be repeated for each required buffer.

Another difference between the FIG. 2 and FIG. 4 embodiments, is that the latter includes a pair of serially connected field effect transistors 71 and 72 in each of the input stages. Transistors 71 and 72 have gates respectively coupled to the drain of transistors 51 and 21. As a result, the drain of transistors 21 and 51 have a very light capacitive loading. Specifically, their capacitive loading is independent of the load driven by the output signal $V_O$; and thus the input stages switch with high speed even under heavy capacitive loading. Further, in order to improve the switching time of transistor 71 and 72, they preferably have a resistance which is substantially less than the resistance through transistors 23 or 52. For example, the resistance of transistors 71 and 72 may be 1/20th of the resistance of transistors 23 and 52.

Various embodiments of the invention have now been described in detail. In addition, many modifications and changes can be made to the above described details without departing from the nature and spirit of the invention. For example, each of the embodiments may be comprised of field effect transistors which are either P-channel or N-channel. Further, means other than a voltage divider may be utilized to generate the reference voltage $V_R$ in the reference stage. Also variable resistance devices other than a single field effect transistor may be utilized to vary the voltage on the source of transistor 21 in accordance with the control signal CTL. Also, the input buffer may be designed with a reference voltage $V_R$ to suit logic families other than $T^2L$. Therefore, since many changes and modifications can be made to the above described details without departing from the nature and spirit of the invention, it is to be understood that the invention is not limited to said details, but is defined by the appended claims.

I claim:

1. An integrated buffer circuit having a selectable stabilized trip voltage; said circuit comprising an input stage and a reference stage; each of said stages including a field effect input transistor, first resistive means coupling a drain of said input transistor to a bias source for providing a resistance there between that is substantially constant, and second resistive means coupling a source of said input transistor to another bias source for providing a resistance there between that is variable in response to control signals applied thereto; means for biasing said reference stage in the linear region at said trip voltage; and means for coupling signals generated by said reference stage to all of said second resistive means as said control signals.

2. A circuit according to claim 1, wherein said field effect transistors are MOS field effect transistors.

3. A circuit according to claim 1, wherein said field effect transistors are P-channel field effect transistors.

4. A circuit according to claim 1, wherein said field effect transistors are N-channel field effect transistors.

5. A circuit according to claim 1, wherein said first resistive means in said input stage and said reference stage each consist of a single field effect transistor.

6. A circuit according to claim 1, wherein said second resistive means in said input stage and said reference stage each consist of a single field effect transistor.

7. A circuit according to claim 1, wherein said input stage and said reference stage each further include a second field effect transistor having a drain connected to a bias source through a third resistive means, a gate coupled to said drain of said first field effect transistor, and a source coupled to said source of said first field effect transistor.

8. A circuit according to claim 7, wherein said resistance of said first resistive means is greater than said resistance of said third resistive means.

9. A circuit according to claim 7, wherein said input stage further includes a pair of serially connected field effect transistors having gates respectively coupled to said drain of said first and second field effect transistors.

10. A circuit according to claim 1, and further including a plurality of said input stages coupled in parallel to said reference stage to simultaneously receive said control signals.

* * * * *